(12) United States Patent
Orton

(10) Patent No.: US 6,909,977 B2
(45) Date of Patent: Jun. 21, 2005

(54) METHOD FOR DIAGNOSING DEGRADATION IN AIRCRAFT WIRING

(76) Inventor: Harry E. Orton, 1894 Lavton Drive, North Vancouver, British Columbia V7H 1X9 (CA)

( * ) Notice: Subject to any disclaimer, the term of this patent is extended or adjusted under 35 U.S.C. 154(b) by 0 days.

(21) Appl. No.: 10/149,530

(22) PCT Filed: Dec. 8, 2000

(86) PCT No.: PCT/CA00/01452

§ 371 (c)(1),
(2), (4) Date: Jul. 29, 2002

(87) PCT Pub. No.: WO01/42802

PCT Pub. Date: Jun. 14, 2001

(65) Prior Publication Data

US 2003/0105598 A1 Jun. 5, 2003

(30) Foreign Application Priority Data

Dec. 8, 1999 (CA) .............................................. 2291939

(51) Int. Cl.⁷ ............................................. G01R 27/00
(52) U.S. Cl. ............................. 702/65; 385/12; 324/96
(58) Field of Search .............................. 702/65, 66, 69, 702/75, 76, 118–121, 183–185, 189, 58, 64; 385/12; 324/96, 501, 522, 529, 544, 536; 340/3.42, 500; 398/6

(56) References Cited

U.S. PATENT DOCUMENTS

| | | | | |
|---|---|---|---|---|
| 4,414,539 A | * | 11/1983 | Armer ......................... | 340/500 |
| 4,774,510 A | * | 9/1988 | Steinke ....................... | 340/3.42 |
| 4,808,814 A | | 2/1989 | Hofer et al. ............ | 250/227.15 |
| 4,959,792 A | | 9/1990 | Sullivan ....................... | 702/58 |
| 5,365,175 A | * | 11/1994 | Patterson et al. ........... | 324/501 |
| 5,434,509 A | * | 7/1995 | Blades ........................ | 324/536 |
| 5,442,515 A | * | 8/1995 | Wallaert ...................... | 361/187 |
| 5,479,610 A | | 12/1995 | Roll-Mecak et al. ......... | 714/95 |
| 5,561,605 A | * | 10/1996 | Zuercher et al. .............. | 702/64 |
| 5,635,829 A | * | 6/1997 | Hamada ........................ | 324/96 |
| 5,640,472 A | * | 6/1997 | Meinzer et al. ................ | 385/26 |
| 6,005,694 A | * | 12/1999 | Liu .............................. | 398/6 |
| 6,114,856 A | * | 9/2000 | Bitts .......................... | 324/522 |
| 6,225,811 B1 | * | 5/2001 | Bruning et al. ............. | 324/544 |
| 6,281,685 B1 | * | 8/2001 | Tuttle .......................... | 324/529 |
| 6,434,285 B1 | * | 8/2002 | Blake et al. ................. | 385/12 |
| 6,434,512 B1 | * | 8/2002 | Discenzo .................... | 702/184 |
| 6,625,550 B1 | * | 9/2003 | Scott et al. .................. | 702/58 |

FOREIGN PATENT DOCUMENTS

| | | |
|---|---|---|
| EP | 0 165 803 | 12/1985 |
| EP | 0 411 863 | 2/1991 |

OTHER PUBLICATIONS

N.Inoue et al., Fault section detection system for 275–kV XLPE–insulated cables with optical sensing technique, Jul. 1995, IEE pp. 1148–1155.*

K.Itaka et al., Fault section detecting system for power cable using optical magnetic field sensor, Nov. 1991, IEEE, p. 644–649.*

* cited by examiner

Primary Examiner—Marc S. Hoff
Assistant Examiner—Mohamed Charioui
(74) Attorney, Agent, or Firm—Greer, Burns & Crain, Ltd.

(57) ABSTRACT

Wiring in new and older aircraft use bundled insulated conductors that are subject to deterioration overtime that can result in on-board fires, loss of in-flight control and eventual crashes of the aircraft. The present invention provides a diagnostic method which permits the on-line and non-destructive diagnosis of the insulation degradation in a portion of the wiring comprising: a) measuring the current flow at locations of the aircraft wiring utilizing an optical current sensor with a bandwidth of dc to 50 kHz; b) determining the current flow within a high frequency bandwidth; and c) analyzing the results of the current flow differential determination and initiate the following: i) detect and locate the point of cable failure; ii) initiate an alarm annunciation; and iii) initiate an on-board sectionalized fire suppression system.

16 Claims, 2 Drawing Sheets

METHOD FOR DIAGNOSING DEGRADATION IN AIRCRAFT WIRING

TECHNICAL FIELD

The invention relates to a method for diagnosing degradation in electrical wiring, and more particularly to a method for diagnosing degradation in aircraft wiring insulation that can be incorporated into the on-board computer of an aircraft for fault location, early warning and initiation of the fire suppression system to prevent disastrous aircraft crashes.

BACKGROUND ART

Control and power supply wiring on commercial and military aircraft and vehicles is provided by low voltage cables that are typically insulated with PTFE (polytetrafluoroethylene) or polyimide, sometimes referred to by the trade names Hypolon™ or Mylar™ insulation. PTFE offers high temperature resistance, high dielectric strength, fluid resistance and low smoke generation. Its weaknesses include susceptibility to cold flow and low dynamic cut-through resistance. Polyimide has all of the properties of PTFE but has improved resistance to dynamic cut-through. Unfortunately polyimide has been found to be susceptible to arc propagation and degradation due to hydrolysis.

Such control cables typically consist of central solid or stranded conductors of copper or aluminum with an insulating layer, twisted in pairs, usually in bundles of 36 pairs or more and protected by a jacket of tough polymer material to prevent abrasive or mechanical damage during installation, maintenance and operation of the aircraft. The insulation of such control cables has a typical life time of about 30 to 40 years. However, various factors can lead to premature degradation of the insulation resulting in the deterioration of the electrical and physical properties of the insulating material and to eventual failure of the cable. These factors can include loss of plasticizer with time and temperature, hydrolysis, cold flow, filamentary alignment of the insulation fibres making any insulation tapes susceptible to cracking, unravelling of taped insulation with age, and loss of dielectric, chemical and mechanical properties due to temperature cycling and high temperature operation. Deterioration of the insulation mechanical properties can be so extensive that cracking and opening of the insulation material can occur. Many older commercial and military aircraft are nearing the end of their service lives but are still operating with possible suspect wiring that could lead to major problems without any warning.

At 400 Hz operation, the normal voltage frequency in these vehicles, sparking to the grounded frame or fuselage and between wires can lead to the catastrophic failure of the control wiring and/or the power supply to electrical servo-motors used to control the plane engines and the flight system. Eventually fire can result in the wiring with complete loss of control of the aircraft. Smoke is a by-product of the event placing personnel at risk.

It is important therefore for aircraft operators to be able to test power and control cables for degradation to allow replacement prior to failure and to permit an orderly replacement schedule. Preferably such testing would be done "live", that is without de-energising the cable prior to testing. There is therefore a need for a diagnostic method which permits on-line, non-destructive live diagnostics in aircraft wiring.

DISCLOSURE OF INVENTION

The invention provides a method of on-line diagnosis of insulation degradation in a portion of an aircraft wiring cable comprising the steps of:

i) measuring the current flow at two locations on said cable utilizing an optical current sensor with a bandwidth of dc to 50 kHz;

ii) determining the current flow difference at one or more frequencies in the range 10 kHz to 50 kHz; and iii) analyzing the results of the current flow difference to locate a potential cable wiring fault.

Preferably, the current flow measurement is carried out at multiple sectionalized locations in the aircraft.

BRIEF DESCRIPTION OF THE DRAWINGS

In drawings which illustrate a preferred embodiment of the invention.

BEST MODES FOR CARRYING OUT THE INVENTION

Figure 1:
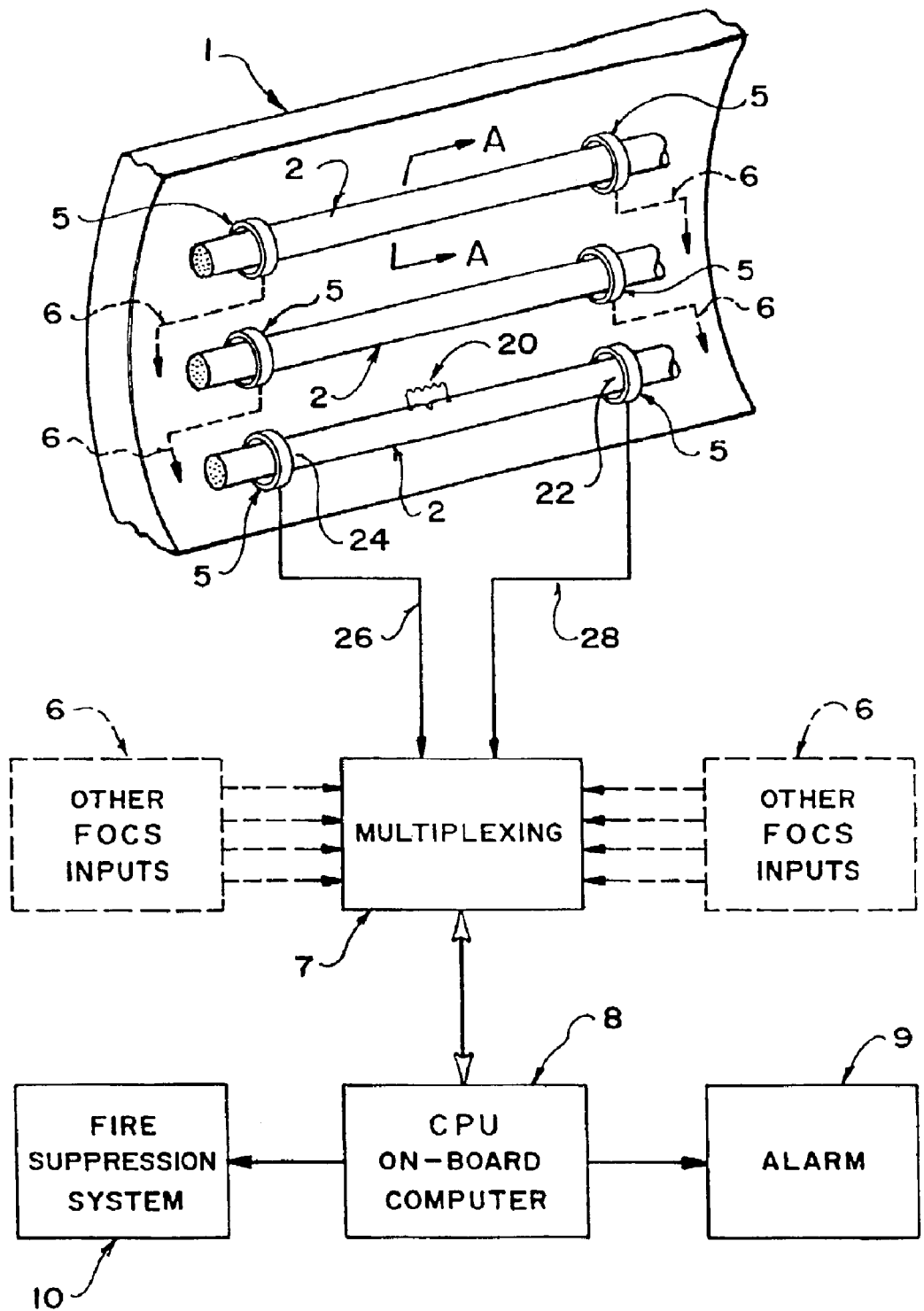
FIG. 1 is a schematic illustration and block diagram of an aircraft wiring system with the proposed diagnostic.
Figure 2:
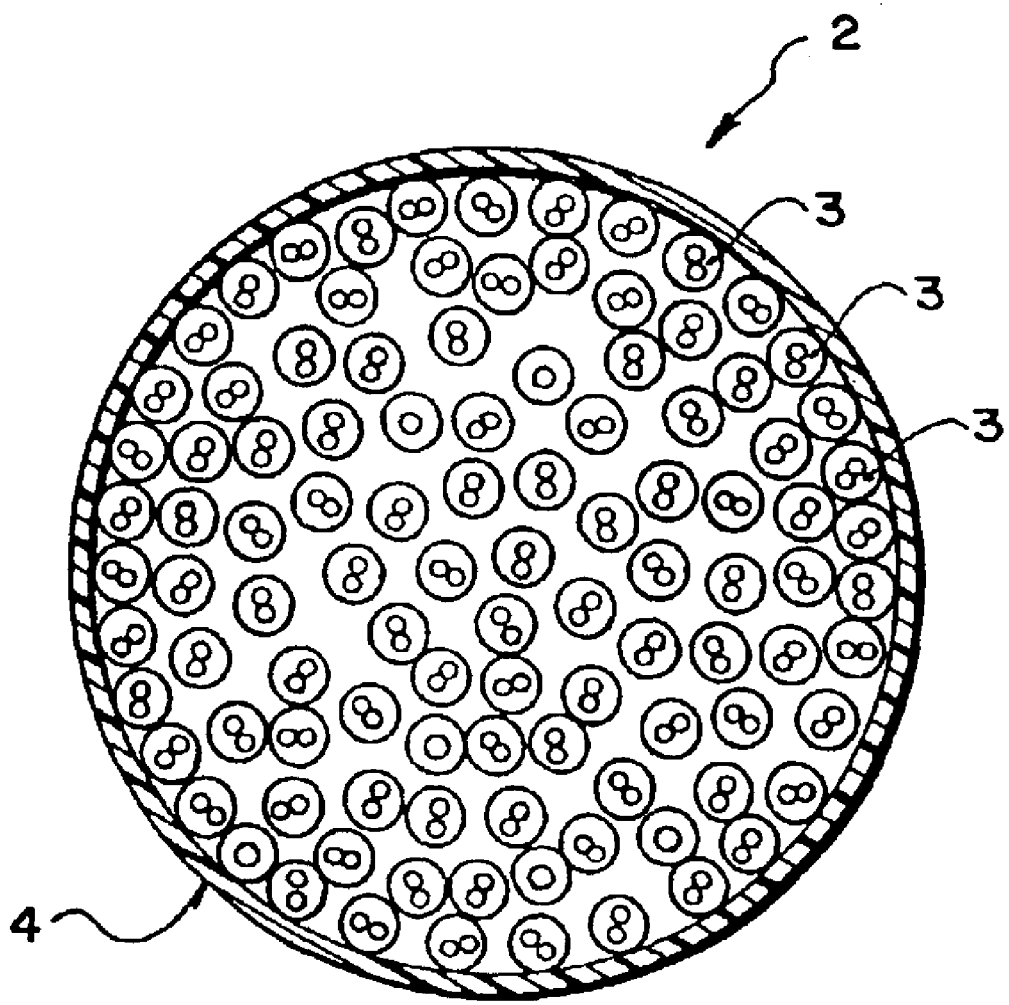
FIG. 2 is a cross-section taken along lines A—A of FIG. 1 of a typical wiring cable used in an aircraft.

With reference to FIGS. 1 and 2, a standard aircraft wiring cable (not to scale), designated as 2, carries an electrical current, typically from a few milliamperes to 10's of amperes at 400 Hz. The cable consists of solid or stranded conductors of copper or aluminum, insulated with PTFE or Polyimide and twisted in pairs 3 and bundled into a large cable with an overall jacket 4. Power conductors are typically single core, whereas the control cables are twisted pairs. Some of these cables also carry direct current, although most carry the 400 Hz ac current generated by the airplane's generator. These cable bundles are mounted on the aircraft fuselage 1 or in cable trays and electronics bays inside the aircraft.

Extrernely accurate optical current sensors 5, which may be fibre, slab or crystal are now available to measure the flow of current in the aircraft wiring. Such sensors have a resolution of $5 \times 10^{-6}$ amperes and a bandwidth of dc to 50 kHz. Optical sensors of this general type are typically manufactured by Sumitomo in Japan and others. A suitable optical current sensor is wrapped around or clipped over the cables 2 at two spaced locations 22, 24. The light within the fibre, slab or crystal is perturbed by the electromagnetic field produced by the current in the conductor and the sensor can be calibrated to measure the current in the conductor with sufficient accuracy and linearity. The output from each optical sensor is eommunicated to the central processing unit or CPU 8 via conductors 26, 28 and a multiplexer 7 that allows simultaneous processing of multiple signals 6 from multiple fibre optic current sensors. The CPU 8 calculates the difference between the cable conductor current flows at 22 and 24 at different frequencies, within a bandwidth excluding 400 Hz. To reduce the effects of background noise, time averaging of the data may be carried out over an extended period. Since sparking or an arc discharge 20 generates a high frequency component in the range of 10 kHz to 50 kHz, readings are taken at frequencies in the 10 kHz to 50 kHz range. The differential is then processed by the CPU 8 at those frequencies, the data is analyzed by the CPU and the presence and location of a potential cable wiring fault may be indicated based on that analysis. The CPU will generate an alarm 9 and depending upon the received signal level from the sensor will initiate a sectionalized fire suppression system 10.

The location of the cable wiring fault or sparking may be calculated by the CPU 8 using a technique called time domain reflectometry or TDR. This method is disclosed in the following publication: Matthew S. Mashikian, "Partial Discharge Location as a Diagnostic Tool for Power Tools" 1999 *IEEE/PES Transmission and Distribution Conference*, New Orleans La., Apr. 11–16, 1999, Panel on Diagnostic Measurement Techniques for Power Cables. See in particular FIG. 3.

Single, open-ended current sensors 5 can also be positioned at single locations on cables which are connected to the aircraft chassis or ground in order to detect sparking or different harmonics. A second diagnostic may also be performed, namely determining the hannonic component of the 400 Hz insulation leakage current to establish the degree of insulation deterioration that has occurred. A badly deteriorated cable will show a leakage current (differential) in a given range at a particular frequency. The method of carrying out the harmonic current analysis is described in the following publications: K. Hirotsu, K Hosoe et al., "Development of Hot-line Diagnosis Method for XLPE Cables by Measurement of Harmonic Current" in *Proceedings of the Symposium on Electrical Insulation Materials*, Osaka Japan, September 1994, Vol. 26, pp. 455–458; J. Densley, "Aging and Diagnostics in Extruded Insulation for Power Cables" in *Proceedings of the 6th International Conference on Conduction and Breakdown in Solid Dielectrics*, Jun. 22–25, 1998, Vasteras, Sweden; J. Densley, "Didactic", *IEEE ICC Minutes*, November 1997, St. Petersburg, Fla.

This diagnostic thus can provide an early detection of impending problems and allow for corrective measures to be taken and so avert any chance of a major disaster. By incorporating an electrical diagnostic on the aircraft wiring as an early detection system and interfacing this diagnostic with the on-board computer or CPU of the aircraft, it is possible to provide an early warning alarm and to initiate the fire suppression system while any fire situation is relatively small. Early detection will allow prompt extinction of any fire and minimize the effort needed to extinguish that fire. For example, a sectionalized water mist or nitrogen gas fire suppression would be capable of extinguishing most small fires if initiated while the fire is still small, thus limiting further fire damage and minimizing the risk to personnel. By sectionalizing the aircraft it is possible to contain any fire to that section without jeopardizing other areas of the aircraft. Possible sections on the aircraft would include the power supply generators, the engines, the fuel tanks, the cockpit, the cargo bays, the passenger compartments and the electronics bays. The diagnostic can be installed in new aircraft as well as retrofitted to older aircraft and can become part of the on-board expert monitoring system already used to detect carbon monoxide, carbon dioxide, oxygen and smoke. Continuous monitoring whenever the aircraft is in operation will add to reliability and operation safety.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method of on-line diagnosis of insulation degradation in a portion of low voltage wiring cable in aircraft and other vehicles having a central processing unit comprising the steps of:
   i) measuring the current flow at two locations on said low voltage cable utilizing an optical current sensor with a bandwidth of dc to 50 kHz;
   ii) communicating said measurements to said central processing unit;
   iii) said central processing unit determining the current flow difference between said two locations at one or more frequencies in the range 10 kHz to 50 kHz;
   iv) said central processing unit analysing the results of the current flow difference determination using at least one diagnostic measurement technique to locate a potential cable wiring fault.

2. The method of claim 1 wherein said current flow has a frequency of 400 Hz.

3. The method of claim 2 wherein said at least one diagnostic measurement technique comprises determining the harmonic component of the 400 Hz insulation leakage current to establish the degree of insulation deterioration that has occurred.

4. The method of claim 2 wherein said at least one diagnostic measurement technique comprises using the output of one of said optical current sensors at one of said locations to measure the harmonic component of the 400 Hz insulation leakage current to establish the degree of insulation deterioration that has occurred.

5. The method of claim 2 wherein the voltage of said current flow is less than 1000 volts.

6. The method of claim 1 wherein said current flow measurement is carried out at multiple sectionalized locations in said aircraft or other vehicle.

7. The method of claim 1 further comprising the step of annunciating an alarm in said central processing unit if a potential cable wiring fault is located.

8. The method of claim 1 further comprising the step of said central processing unit initiating an on-board fire suppression system if a potential cable wiring fault is located.

9. The method of claim 1 wherein said at least one diagnostic measurement technique comprises a time domain reflectometry technique.

10. The method of claim 1 wherein steps i), ii) and iii) are performed a plurality of times over a period of time and the resultant plurality of current flow differences are averaged for purposes of the analysis in step iv).

11. An aircraft or other vehicle having an insulated low voltage electrical cable, comprising optical current sensors with a bandwidth of dc to 50 kHz mounted at two spaced locations on said low voltage cable for measuring the current flow at said two spaced locations on said cable, and central processing means connected to said optical current sensors comprising computer readable program code means for determining the current flow difference at one or more frequencies in the range 10 kHz to 50 kHz and analysing the results of the current flow difference to locate a potential cable wiring fault using at least one diagnostic measurement technique.

12. The aircraft or other vehicle of claim 11 wherein said current flow has a frequency of 400 Hz.

13. The aircraft or other vehicle of claim 12 wherein said at least one diagnostic measurement technique comprises further determining the harmonic component of the 400 Hz insulation leakage current to establish the degree of insulation deterioration that has occurred by using the output of one of said optical current sensors at one of said locations to measure the harmonic component of the 400 Hz insulation leakage current.

14. The aircraft or other vehicle of claim 12 wherein the voltage of said current flow is less than 1000 volts.

15. The aircraft or other vehicle of claim 11 wherein said central processing means is adapted to make a plurality of said measurements of current flow over a period of time to provide a plurality of current flow differences and average said plurality of current flow differences for purposes of analysing the results of the current flow difference to locate a potential cable wiring fault.

16. The aircraft or other vehicle of claim 11 wherein said at least one diagnostic measurement technique comprises a time domain reflectometry technique.

* * * * *